(12) United States Patent
Lee

(10) Patent No.: US 7,417,899 B2
(45) Date of Patent: Aug. 26, 2008

(54) METHOD OF VERIFYING FLASH MEMORY DEVICE

(75) Inventor: Min Kyu Lee, Icheon-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 109 days.

(21) Appl. No.: 11/557,337

(22) Filed: Nov. 7, 2006

(65) Prior Publication Data

US 2007/0263451 A1      Nov. 15, 2007

(30) Foreign Application Priority Data

May 10, 2006    (KR) ................... 10-2006-0041768

(51) Int. Cl.
*G11C 11/34* (2006.01)
(52) U.S. Cl. .................... 365/185.22; 365/185.25; 365/230.04
(58) Field of Classification Search ............ 365/185.22, 365/185.25, 230.04
See application file for complete search history.

(56) References Cited

U.S. PATENT DOCUMENTS

| 6,049,492 A | 4/2000 | Vogelsang et al. |
| 7,072,225 B2 * | 7/2006 | Takase et al. ........... 365/185.28 |
| 7,095,657 B2 * | 8/2006 | Takase et al. ........... 365/189.05 |
| 7,180,784 B2 * | 2/2007 | Ju .......................... 365/185.22 |
| 7,257,027 B2 * | 8/2007 | Park ....................... 365/185.11 |

FOREIGN PATENT DOCUMENTS

| JP | 09-180483 | 12/1995 |
| JP | 2002-279788 | 9/2002 |
| KR | 10-0224275 | 7/1999 |
| KR | 1999-0075686 | 10/1999 |

* cited by examiner

*Primary Examiner*—Tuan T Nguyen
(74) *Attorney, Agent, or Firm*—Marshall, Gerstein & Borun LLP

(57) ABSTRACT

A method of verifying a flash memory device includes discharging memory cell strings respectively connected to an even bit line and an odd bit line. Next, a voltage is applied to the memory cell strings respectively connected to the even bit line and the odd bit line, thus precharging the memory cell strings. The memory cell string connected to the even bit line are verified as erased by sensing the status of each memory cell string connected to the even bit line, and the memory cell string connected to the odd bit line are verified as erased by sensing the status of the memory cell string connected to the odd bit line.

9 Claims, 2 Drawing Sheets

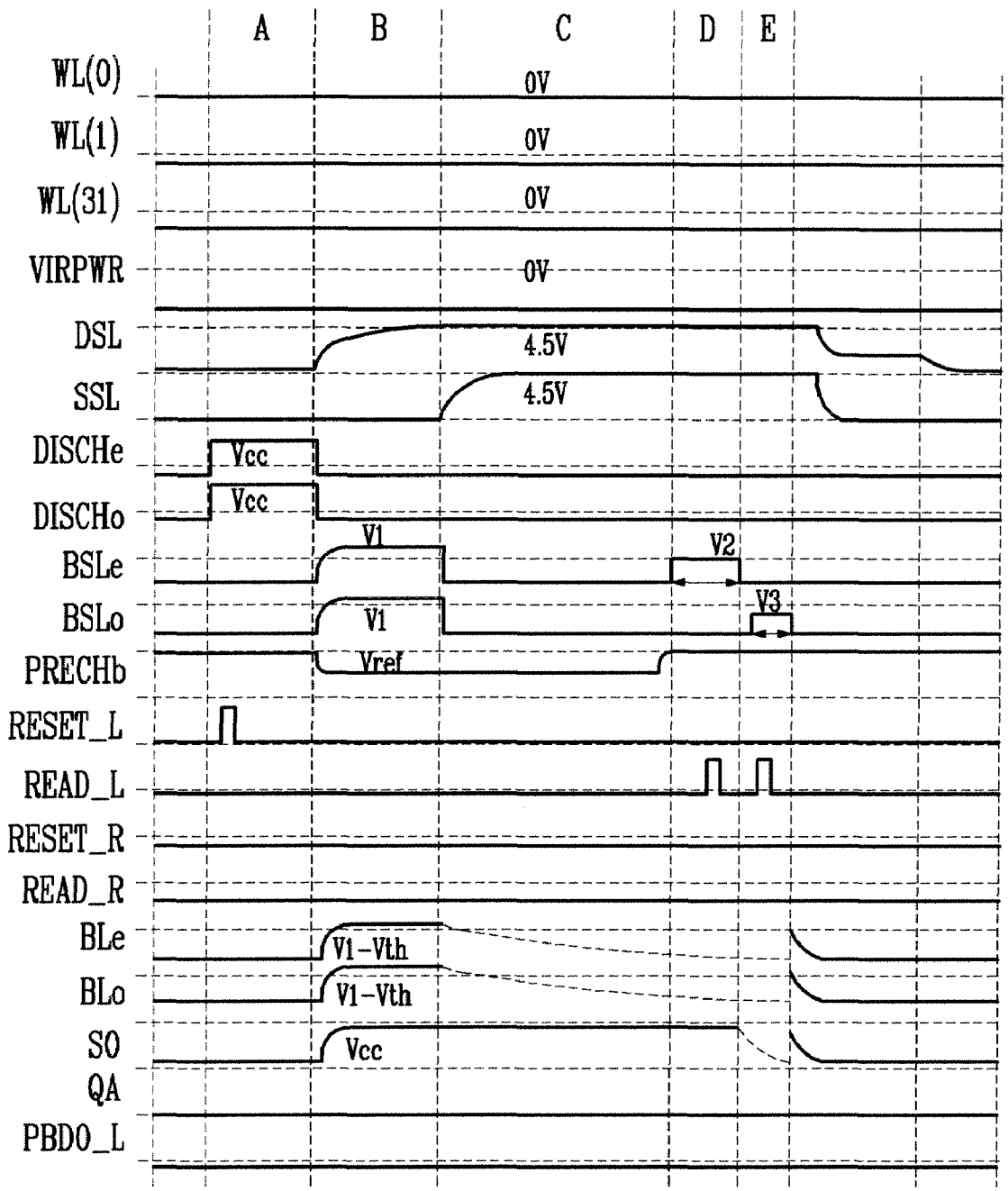

METHOD OF VERIFYING FLASH MEMORY DEVICE

BACKGROUND

1. Technical Field

This patent relates, in general, to a flash memory device and, more particularly, to a method of verifying a flash memory device using a page buffer, in which a program or erase verify time can be reduced and an overall driving time can be shortened.

2. Discussion of Related Art

In recent years, there is an increasing demand for semiconductor memory devices which can be electrically programmed and erased and do not require a refresh function of rewriting data at regular intervals. Furthermore, to develop memory devices with a large capacity capable of storing large amounts of data, a high-integrated technique of memory cells has been developed.

To increase the integration of the memory cells, a NAND flash memory device may have a plurality of cells are connected in series to form one string and two strings share one contact. In the NAND flash memory device, program and erase are performed by controlling a threshold voltage of the memory cell while injecting and discharging electrons into and from a floating gate by means of F-N tunneling.

Accordingly, an erased cell has a negative threshold voltage since the electrons of the floating gate are discharged from the cell. A programmed cell has a positive threshold voltage since the electrons are injected into the floating gate. In the case of the NAND flash memory device, however, a fail may occur due to a charge gain or charge loss. Some verifications may be performed in relation to these characteristics. In order to verify whether program and erase have been performed normally, a page buffer is used.

The page buffer serves to receive a large capacity of data from an I/O pad and supply the received data to memory cells or store data of memory cells and then output the stored data. In the past, the page buffer was constructed of a single register in order to temporarily store data. The page buffer is now comprised of a dual register in order to increase the program speed when programming a large capacity of data in the NAND flash memory device.

To perform erase verification of the NAND flash memory device having the page buffer of the dual register structure, a column scan method of confirming whether all cells have been turned on by applying a voltage of 0V to the entire word lines is used. In the column scan method, fail is determined if one cell is turned off.

For the purpose of erase verification, erase verification is performed on a selected bit line through three steps, including precharge, evaluation, and sensing, in the same manner as a common read operation. In the column scan method, erase verification is implemented by dividing the bit lines into even bit lines and odd bit lines. Accordingly, after the even bit lines are verified, the odd bit lines are verified. Therefore, whether erase has been performed is determined through the twice verify process. It results in a long erase verify time.

Meanwhile, in a multi-level cell, threshold voltage distributions of an erase cell have an effect on the threshold voltage of a program cell. Accordingly, a post program is performed on a cell on which erase has been completed. The post program is performed by employing an ISPP method and erase verification is performed after the post program. Accordingly, if the erase verify time becomes long, an overall erase time is lengthened.

Furthermore, at the time of program, a program verify time is lengthened in the same manner as the above. Accordingly, an overall program time becomes long.

SUMMARY OF THE INVENTION

Accordingly, the present patent addresses the above problems, and discloses a method of verifying a flash memory device, in which it can shorten a verify time and shorten an overall driving time.

The present patent further discloses a method of verifying a flash memory device, wherein an even bit line and an odd bit line are precharged and evaluated at the same time and are then sequentially sensed, thus reducing a verify time.

The present patent further discloses a method of verifying a flash memory device, wherein it can reduce a verify time by half compared with the prior art and can therefore reduce an overall driving time by $2/3$ compared with the prior art by precharging and evaluating even bit lines and odd bit lines at the same time and then sequentially sensing the even bit lines and the odd bit lines.

According to an aspect of the present invention, there is provided a method of verifying a flash memory device, including the steps of discharging memory cell strings respectively connected to an even bit line and an odd bit line, applying a voltage to each memory cell strings respectively connected to the even bit line and the odd bit line, thus precharging the memory cell strings, verifying whether the memory cell string connected to the even bit line has been erased by sensing the status of the memory cell string connected to the even bit line, and verifying whether the memory cell string connected to the odd bit line has been erased by sensing the status of the memory cell string connected to the odd bit line.

Also described in this patent is a method of verifying a flash memory device, including discharging memory cell strings respectively connected to even bit line and odd bit line, applying a voltage to the memory cell strings respectively connected to the even bit line and the odd bit line, thus precharging the memory cell strings, verifying whether the memory cell string connected to the even bit line has been programmed by sensing the status of the memory cell string connected to the even bit line, and verifying whether the memory cell string connected to the odd bit line has been programmed by sensing the status of the memory cell string connected to the odd bit line.

Still further this patent describes a method of verifying a flash memory device, wherein the flash memory device includes a first transistor for supplying a verify signal to a memory cell array through even bit line and odd bit line in response to a first control signal, a second transistor for connecting the memory cell array and a first node through the even bit line and odd bit line in response to a second control signal, a third transistor for supplying a current to the first node in response to a third control signal, a latch for storing output data from a selected cell of the memory cell array, a fourth transistor for controlling the status of the latch according to a voltage level of the first node and a fourth control signal. The method includes discharging memory cell strings respectively connected to the even bit line and the odd bit line in response to the first control signal and at the same time, supplying a voltage to the first node in response to the third control signal and at the same time, supplying a voltage of the first node to the memory cell strings respectively connected to the even bit line and the odd bit line in response to the second control signal of a first voltage level, thus precharging the memory cell strings, verifying whether the memory cell string connected to the even bit line has been erased by storing the status of the memory cell string connected to the even bit line in response to the second control signal of a second voltage level, and verifying whether the memory cell string connected to the odd bit lines has been erased by storing the status of the memory cell string connected to the odd bit line in response to the second control signal of a third voltage level.

The first control signal may be kept to a voltage level of 1.6 to 5.5 V or a power supply voltage Vcc.

The second control signal of the first voltage level may be kept to a voltage level of 1.0 to 5.5 V or a power supply voltage Vcc, the second control signal of the second voltage level and the third voltage level may be kept to a voltage level of 1.0 to 2.2 V, and the second voltage level may be kept to a voltage level that is the same as or higher than the first voltage level.

An application time of the second control signal of the second voltage level may be set longer than that of the second control signal of the third voltage level.

BRIEF DESCRIPTION OF THE DRAWINGS

FIG. 2 is an operational waveform of the page buffer for illustrating a method of verifying a NAND flash memory device according to an embodiment of the present invention.

DETAILED DESCRIPTION OF EMBODIMENTS

Figure 1:
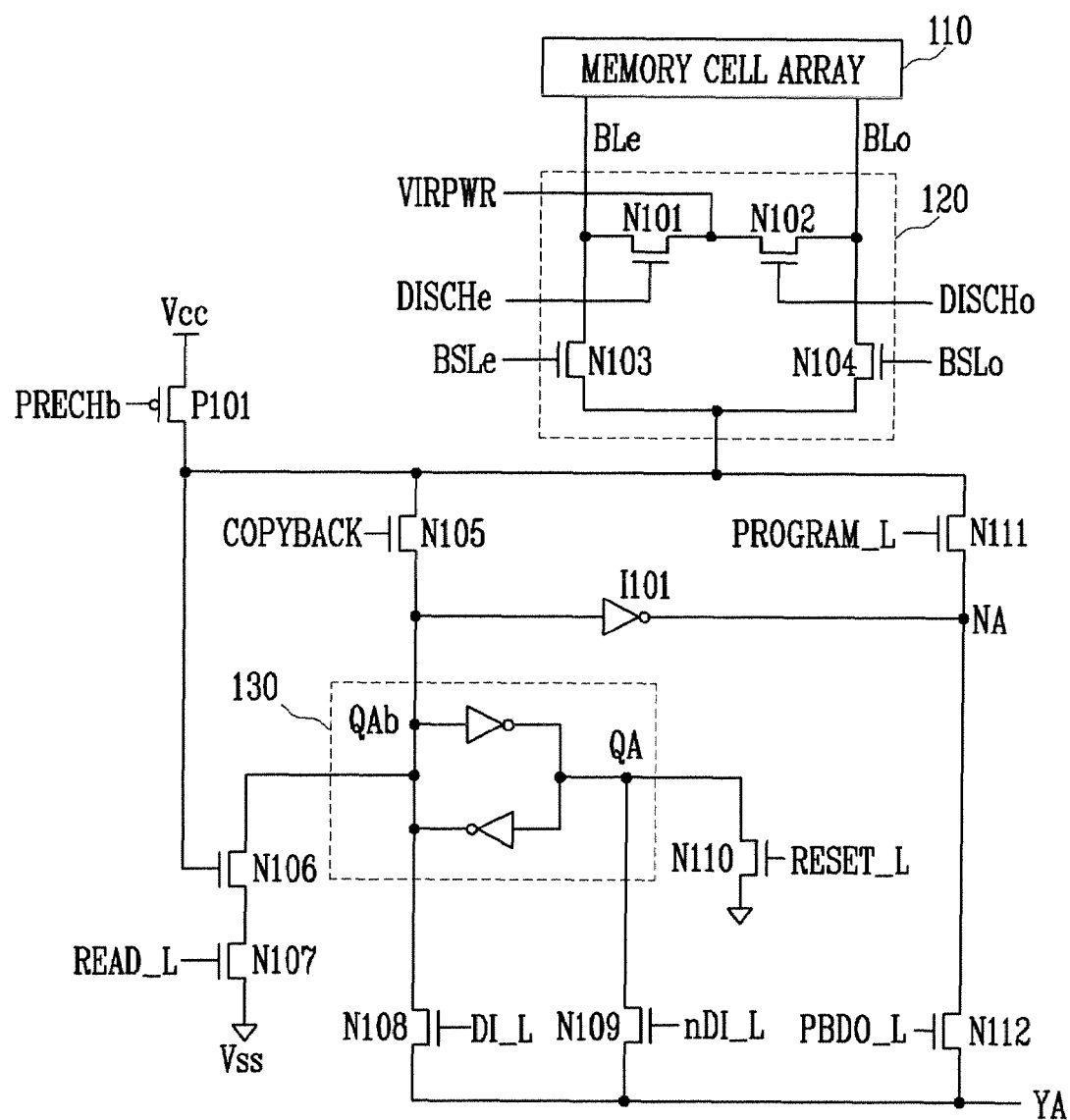
FIG. 1 is a circuit diagram of a page buffer used in a method of verifying a NAND flash memory device according to an embodiment of the present invention.

Now, the various embodiments according to the present patent will be described with reference to the accompanying drawings. Because various embodiments are provided for the purpose that the ordinary persons skilled in the art are able to understand the present patent, they may be modified in various manners and the scope of the present patent is not limited by the various embodiments described later.

FIG. 1 is a circuit diagram of a page buffer used in a method of verifying a NAND flash memory device according to an embodiment of the present invention. There is shown in FIG. 1 a circuit diagram of a main register in a page buffer of a dual register structure having a main register and a cache register.

Referring to FIG. 1, a bit line selection unit 120 includes a plurality of transistors. First and second NMOS transistors N101 and N102 are driven in response to even and odd discharge signals DISCHe and DISCHo, respectively, and accordingly apply a verify voltage VIRPWR to a memory cell string of a memory cell array 110 connected to an even bit line BLe or an odd bit line BLo. Third and fourth NMOS transistors N103 and N104 are driven in response to even and odd bit line select signals BSLe and BSLo, respectively, and accordingly, connect a bit line of the memory cell array 110 and a sense node SO.

A PMOS transistor P101 is driven in response to a precharge signal PRECHb and thus applies a voltage to the sense node SO.

A fifth NMOS transistor N105 connects the sense node SO and an output node QAb of a latch 130 in response to a copyback signal COPYBACK at the time of a copyback program. The latch 130 temporarily stores output data output from the memory cell array 110 and externally supplied data. A sixth NMOS transistor N106 is driven according to a voltage level of the sense node SO. A seventh NMOS transistor N107 is driven in response to a read signal READ_L and thus connects the output node QAb of the latch 130 and a ground terminal Vss.

An eighth NMOS transistor N108 is driven in response to a signal DI_L and thus connects an I/O terminal YA and the output node QAb of the latch 130. A ninth NMOS transistor N109 is driven in response to a signal nDI_L and thus connects the I/O terminal YA and an input node QA of the latch 130. A tenth NMOS transistor N110 is driven in response to a reset signal RESET_L and accordingly resets the latch 130. An eleventh NMOS transistor N111 is driven in response to a signal PROGRAM_L at the time of a program operation and thus transmits information to be programmed to a selected bit line.

A twelfth NMOS transistor N112 is driven in response to a signal PBDO_L and thus outputs a voltage level of a program node NA. Furthermore, an inverter I101 inverts a voltage level of the output node QAb of the latch 130 and transfers an inverted voltage level to the program node NA.

FIG. 2 is an operational waveform of the page buffer for illustrating a method of verifying a NAND flash memory device according to an embodiment of the present invention. An erase verification method of a NAND flash memory device according to an embodiment of the present invention will be described below with reference to FIGS. 1 and 2.

1) Period A: Discharge

The even and odd discharge signals DISCHe and DISCHo are applied as a high level of 1.6 to 5.5 V or a power supply voltage Vcc at the same time for the same time period, so that the first and second NMOS transistors N101 and N102 are turned on. Accordingly, a voltage level of the verify signal VIRPWR is supplied to the bit lines BLe and BLo through the first and second NMOS transistors N101 and N102. The verify signal VIRPWR at the time of erase verification maintains a voltage level of 0 V. Accordingly, the even and odd bit lines BLe and BLo are applied with a voltage of 0 V. Furthermore, the reset signal RESET_L is applied as a pulse of a high level, so that the tenth NMOS transistor N110 is turned on. Accordingly, the node QA becomes a low level and the node QAb maintains a high level. As a result, the latch 130 is reset. At this time, the entire word lines WL0 to WL31 are applied with a voltage of 0 to 1 V, and the drain select line DSL and the source select line SSL are also applied with a voltage of 0 V.

2) Period B: Precharge

As the even and odd discharge signals DISCHe and DISCHo are applied as a low level, the first and second NMOS transistors N101 and N102 are turned off. Furthermore, since the precharge signal PRECHb is applied as a low level, the first PMOS transistor P201 is turned on. Accordingly, the power supply voltage Vcc is applied to the sense node SO, so that the sense node SO maintains a high level. Furthermore, the even and odd bit line select signals BSLe and BSLo are applied as a voltage level of 1.0 to 5.5 V or a first voltage V1 of approximately the power supply voltage Vcc. Therefore, the even and odd bit lines BLe and BLo are respectively applied with the first voltage V1 and a voltage (V1-Vt) in which a threshold voltage Vt of the third or fourth NMOS transistor N103 or N104 is subtracted from the first voltage V1. In this case, the drain select line DSL is applied with a voltage.

3) Period C: Evaluation

As the even and odd bit line select signals BSLe and BSLo are applied as a low level, the third and fourth NMOS transistors N103 and N104 are turned off. Accordingly, the supply of power to the even and odd bit lines BLe and BLo is stopped, and the voltage levels of the even and odd bit lines BLe and BLo are controlled according to the states of the memory cells connected to the even and odd bit lines BLe and BLo, respectively. That is, if the memory cell is not in an erase state, the voltage level of the even or odd bit line BLe or BLo is kept to that of V1-Vt. However, if the memory cell is in an erase state, the voltage level of the even or odd bit line BLe or BLo is gradually decreased from V1-Vt and is then kept to a low level. At this time, since the first PMOS transistor P101 remains turned on by the precharge signal PRECHb of a low level, the sense node SO maintains a high level. Meanwhile, a signal of a high level is applied through a drain select line DSL and a source select line SSL. The cell evaluation period is set to remain for 10 μs or less time.

4) Period D: Even Cell Sensing

As the precharge signal PRECHb is applied as a high level, the first PMOS transistor P201 is turned off. As the even bit line select signal BSLe is applied as a second voltage V2 that maintains a voltage level of about 1.0 to 2.2 V, the third NMOS transistor N103 is turned on. If the memory cell is not an erase cell, the voltage level of the even bit lines BLe is kept to that of V1-Vt and the voltage level of the sense node SO is kept to a high level. If the memory cell is in an erase state, the voltage level of the even bit lines BLe is gradually decreased and is then kept to a low level, and the voltage level of the sense node SO is kept to a low level. In this state, if the read signal READ_L is applied as a pulse of a high level for 1.0 to 10 μs, the sense node SO is kept to a high level when a memory cell is not an erase cell. Accordingly, the sixth NMOS transistor N106 is turned on and the seventh NMOS transistor N107 is turned on in response to the read signal READ_L of a high pulse. Consequently, the node QAb is kept to a low level and the node QA is kept to a high level. To the contrary, if the memory cell is the erase cell, the sense node SO is kept to a low level and the seventh NMOS transistor N107 is turned off. Therefore, the node QAb is kept to a high level and the node QA is kept to a low level. Accordingly, the voltage level of the node QA is detected in order to sense the states of the even cells.

5) Period E: Odd Cell Sensing

As the even bit line select signal BSLe is applied as a low level, the third NMOS transistor N103 is turned off. As the odd bit line select signal BSLo is applied as a third voltage V3 that is kept to a voltage level of about 1.0 to 2.2 V, the fourth NMOS transistor N104 is turned on. It is required that the third voltage V3 be lower than or the same as the second voltage V2 and the application time of the third voltage V3 be shorter than that of the second voltage V2. If the memory cell is not an erase cell, the voltage level of the odd bit line BLo is kept to that of V1-Vt and the voltage level of the sense node SO is kept to a high level.

However, if the memory cell is in an erase state, the voltage level of the odd bit lines BLo is gradually decreased and is then kept to a low level, and the voltage level of the sense node SO is kept to a low level. In this state, the read signal READ_L is applied as a pulse of a high level for 1.0 to 10 μs. If the memory cell is not in the erase cell, the sense node SO is kept to a high level. Accordingly, the sixth NMOS transistor N106 is turned on and the seventh NMOS transistor N107 is turned on in response to the read signal READ_L of a high pulse. Since the node QAb is kept to a low level, the node QA is kept to a high level. To the contrary, if the memory cell is the erase cell, the sense node SO is kept to a low level and the seventh NMOS transistor N107 is turned off. Therefore, the node QAb is kept to a high level and the node QA is kept to a low level. Accordingly, the voltage level of the node QA is detected in order to sense the states of the odd cells.

An erase verify method of the NAND flash memory device in accordance with an embodiment of the present invention has been described above. However, the method may be applied to a program verify method in the same manner. Accordingly, a detailed description of such a method is thereof omitted.

As described above, even bit line and odd bit line are precharged and evaluated at the same time and are then sequentially sensed. Accordingly, an erase verify time can be reduce by as much as half compared with the prior art and an overall erase time can be reduced by as much ⅔ compared with the prior art. It is therefore possible to improve the operating speed of a device. Furthermore, the present invention can be applied to program verification in the same manner. It is therefore also possible to reduce a program time.

Although the foregoing description has been made with reference to the various embodiments, it is to be understood that changes and modifications of the present patent may be made by the ordinary skilled in the art without departing from the spirit and scope of the present patent and appended claims.

What is claimed is:

1. A method of verifying a flash memory device, comprising:
    discharging memory cell strings respectively connected to an even bit line and an odd bit line;
    applying a voltage to the memory cell strings respectively connected to the even bit line and the odd bit line, thus precharging the memory cell strings;
    verifying whether each memory cell string connected to the even bit line has been erased by sensing the status of the memory cell string connected to the even bit line; and
    verifying whether each memory cell string connected to the odd bit line has been erased by sensing the status of the memory cell string connected to the odd bit line.

2. A method of verifying a flash memory device, the flash memory device comprising:
    a first transistor for supplying a verify signal to a memory cell array through even bit line and odd bit line in response to a first control signal;
    a second transistor for connecting the memory cell array and a first node through the even bit line and odd bit line in response to a second control signal;
    a third transistor for supplying a current to the first node in response to a third control signal;
    a latch for storing output data from a selected cell of the memory cell array;
    a fourth transistor for controlling the status of the latch according to a voltage level of the first node and a fourth control signal,
    the method comprising:
    discharging memory cell strings respectively connected to the even bit line and the odd bit line in response to the first control signal;
    supplying a voltage to the first node in response to the third control signal and at the same time, supplying a voltage of the first node to the memory cell strings respectively connected to the even bit line and the odd bit line in response to the second control signal of a first voltage level, thus precharging the memory cell strings;
    verifying whether each memory cell string connected to the even bit line has been erased by storing the status of each memory cell string connected to the even bit line in response to the second control signal of a second voltage level; and
    verifying whether each memory cell string connected to the odd bit line has been erased by storing the status of each memory cell string connected to the odd bit line in response to the second control signal of a third voltage level.

3. The method of claim 2, wherein the first control signal is kept to 1.6 to 5.5 V or a voltage level of a power supply voltage Vcc.

4. The method of claim 2, wherein the second control signal of the first voltage level is kept to a voltage level of 1.0 to 5.5 V or a power supply voltage Vcc.

5. The method of claim 2, wherein the second control signal of the second voltage level is kept to a voltage level of 1.0 to 2.2 V.

6. The method of claim 2, wherein the second control signal of the third voltage level is kept to a voltage level of 1.0 to 2.2 V.

7. The method of claim 2, wherein the second voltage level is kept to a voltage level that is the same as or higher than the first voltage level.

8. The method of claim 2, wherein an application time of the second control signal of the second voltage level is set longer than that of the second control signal of the third voltage level.

9. A method of verifying a flash memory device comprising:

discharging memory cell strings respectively connected to an even bit line and an odd bit line;

applying a voltage to each memory cell string respectively connected to the even bit line and the odd bit line, thus precharging the memory cell strings;

verifying whether each memory cell string connected to the even bit line has been programmed by sensing the status of each memory cell string connected to the even bit line; and verifying whether each memory cell string connected to the odd bit line has been programmed by sensing the status of each memory cell string connected to the odd bit line.

* * * * *